(12) United States Patent  (10) Patent No.: US 8,179,174 B2
Bunch  (45) Date of Patent: May 15, 2012

(54) FAST PHASE LOCKING SYSTEM FOR AUTOMATICALLY CALIBRATED FRACTIONAL-N PLL

(75) Inventor: Ryan Lee Bunch, Greensboro, NC (US)

(73) Assignees: MStar Semiconductor, Inc., Hsinchu Hsien (TW); MStar Software R&D (Shenzhen) Ltd., Guangdong (CN); MStar France SAS, Issy les Moulineaux (FR); MStar Semiconductor, Inc. (Cayman Islands), Grand Cayman (KY)

( * ) Notice: Subject to any disclaimer, the term of this patent is extended or adjusted under 35 U.S.C. 154(b) by 186 days.

(21) Appl. No.: 12/816,059

(22) Filed: Jun. 15, 2010

(65) Prior Publication Data

US 2011/0304365 A1  Dec. 15, 2011

(51) Int. Cl.
*H03L 7/06* (2006.01)

(52) U.S. Cl. ........................ 327/156; 327/147
(58) Field of Classification Search .............. 327/147, 327/156
See application file for complete search history.

(56) References Cited

U.S. PATENT DOCUMENTS

| | | | |
|---|---|---|---|
| 4,560,950 A | 12/1985 | Cabot | |
| 5,304,951 A | 4/1994 | Cosand | |
| 5,446,416 A * | 8/1995 | Lin et al. ........................ | 331/11 |
| 6,504,437 B1 | 1/2003 | Nelson et al. | |
| 6,906,565 B2 | 6/2005 | Keaveney | |
| 6,940,356 B2 | 9/2005 | McDonald, II et al. | |
| 7,327,196 B2 | 2/2008 | Goldberg | |
| 7,436,227 B2 * | 10/2008 | Thomsen et al. .............. | 327/147 |
| 7,825,708 B2 * | 11/2010 | Thomsen et al. .............. | 327/156 |
| 7,898,343 B1 * | 3/2011 | Janesch ........................... | 331/16 |
| 2004/0232995 A1 * | 11/2004 | Thomsen et al. ................. | 331/2 |
| 2006/0119402 A1 * | 6/2006 | Thomsen et al. .............. | 327/105 |
| 2006/0119437 A1 * | 6/2006 | Thomsen et al. ............... | 331/10 |
| 2008/0284530 A1 * | 11/2008 | Pellerano et al. .............. | 331/1 A |
| 2008/0292311 A1 * | 11/2008 | Daghighian et al. .............. | 398/9 |
| 2009/0039968 A1 * | 2/2009 | Thomsen et al. ............... | 331/10 |
| 2009/0238312 A1 * | 9/2009 | Shi et al. ........................ | 375/344 |
| 2010/0009641 A1 * | 1/2010 | Osman et al. .................. | 455/102 |
| 2010/0067612 A1 * | 3/2010 | Chen et al. ..................... | 375/294 |
| 2010/0264993 A1 * | 10/2010 | Wang et al. .................... | 331/1 A |
| 2010/0271137 A1 * | 10/2010 | Kythakyapuzha et al. ..... | 331/16 |
| 2011/0064150 A1 * | 3/2011 | Uozumi et al. ................ | 375/259 |
| 2011/0304365 A1 * | 12/2011 | Bunch ............................ | 327/157 |
| 2012/0013409 A1 * | 1/2012 | Maeda ............................ | 331/34 |
| 2012/0025882 A1 * | 2/2012 | Shanan .......................... | 327/157 |

* cited by examiner

*Primary Examiner* — Lincoln Donovan
*Assistant Examiner* — Adam Houston
(74) *Attorney, Agent, or Firm* — WPAT., P.C.; Justin King

(57) ABSTRACT

The current invention provides a second feedback loop around the existing FLL, which forces the signal on the route of N-divider (NDIV), PFD, CP, and LPF to essentially reach their desired lock conditions before the FLL is switched off and the system enters PLL mode. This loop works by comparing the output voltage of the FLL DAC to the LPF output voltage, and then using this value to modulate the divider's dividing value. After the secondary feedback loop settles, output voltage from the LPF will be equal to the value that can drive the VCO to the desired lock frequency, and the phase error at the input side of the PFD produces a zero-average current to the charge pump. When this condition is set, the loop is essentially already in phase lock and the lock transient from the FLL mode to the PLL mode will be minimal.

18 Claims, 11 Drawing Sheets

FAST PHASE LOCKING SYSTEM FOR AUTOMATICALLY CALIBRATED FRACTIONAL-N PLL

FIELD OF THE INVENTION

This invention relates to an automatically calibrated fractional-N phase lock loop (PLL), and more particularly to an automatically calibrated fractional-N PLL with a shortened and improved initial lock time.

BACKGROUND OF THE INVENTION

Many PLL IC's with integrated LC voltage controlled oscillator (VCO) utilize a digitally programmable coarse tuning word in parallel with the fine tuning varactor. These PLL's require a digital coarse tuning system to select the appropriate digital coarse tuning word for the VCO. Furthermore, in order to reduce PLL bandwidth variation due to VCO tuning gain (Kv) variation, the VCO tuning gain Kv can be measured and compensated by adjusting charge pump current. As shown in FIG. 9, a frequency locked loop (FLL) system is employed to both select the appropriate coarse tuning digital word ct_val and to measure and compensate the VCO (106) tuning gain by modifying the charge pump 706 output current. An FLL differs from a PLL in that it detects frequency error rather than phase error and drives frequency error rather than phase error (as in a PLL) to zero. Since the VCO in an FLL does not act as an integrator converting voltage into phase, an FLL is a Type I (single integrator) control loop. Type I loops can be designed for very fast transient response. The FLL is used to perform coarse tuning (CT) and Kv calibration because of its inherent simplicity and its relatively fast transient response.

In the coarse tuning calibration sequence, the FLL controls the VCO coarse tuning (ct_val) directly. The coarse tuning FLL comprises the digital frequency detector 1006, the coarse tune digital loop filter 1206, and the VCO 106. The Kv calibration FLL comprises the digital frequency detector 1006, the Kv compensation digital loop filter 1106, the DAC 506, and the VCO 106. In the coarse tuning sequence, the coarse tune digital loop filter 1206 provides a coarse tuning digital word ct_val to the coarse tuning input port of the VCO 106. In the Kv calibration sequence, the Kv compensation digital loop filter 1106 drives the digital-to-analog converter (DAC) 506 to provide the VCO fine tuning voltage through the Vtune analog input port of the VCO 106. After the coarse tuning and Kv calibration sequences are completed the system exits FLL mode and enters PLL mode. Although, the FLL converges to zero frequency error very quickly and PLL mode is engaged with zero frequency error, it may still require a long acquisition time to phase lock using the circuit of FIG. 9. The phase lock time of a PLL has a strong dependency on the initial phase error at the input end of the phase frequency detector (PFD) 606. Since the FLL tracks frequency rather than phase, any signal traveling on the route of frequency divider 906, phase frequency detector 606, charge pump (CP) 706, and the loop filter (LPF) 806 is ignored during the FLL mode; and this initial phase error is random; therefore, the phase at the inputs to the PFD 606 remains arbitrary and random. Because the phase error can be any value after calibration it can take a relatively long time to lock the PLL even though the initial frequency error of the VCO is near zero.

FIG. 1 and FIG. 2 show the schematic of a 3-state phase detector common in the industry and its associated state diagram. FIG. 3-6 illustrate four different scenarios of the phase error value when the phase detector is first initialized assuming the UP=0, DN=0 is the reset state. These figures show cases were the frequency error is zero, (i.e. period of Fv is the same as Fr) as would be the case at the switchover from FLL to PLL mode in the system of FIG. 9.

FIG. 3-6 illustrate the relationship among the reference frequency (Fr), the divided frequency (Fv) generated by the frequency divider 906, the pump-up (PU) signal, and the pump-down (PD) signal. The PFD 606 receives both Fr and Fv, then provides the PU signal and PD signal to the charge pump 706 based on the phase difference between the Fr and Fv. These figures assume a system with both a positive Kv and a non-inverting loop filter (i.e. PU causes VCO to be pushed to higher frequency and PD pushes to lower frequency). In systems with negative Kv or an inverting loop filter the polarities shown in the figures can be adjusted accordingly.

FIG. 3 shows that the edge of the Fv is slightly beyond the edge of the Fr; therefore, the PU signal is provided to speed up the VCO and to push Fv to catch up with the Fr. FIG. 4 shows that the edge of the Fr is slightly beyond the edge of the Fv; therefore, the PD signal is provided to slow down the VCO and to cause the Fr to catch up with Fv. In both cases illustrated in FIG. 3 and FIG. 4, the PLL will force the VCO away from zero frequency error in order to accelerate or decelerate the phase so that the edges of Fv will catch up by occurring earlier or slow down by occurring later. Since the phase errors in FIG. 3 and FIG. 4 are relatively small, they do not require significant lock time, since the loop responds by pushing the VCO in the correct direction.

FIG. 5 and FIG. 6 illustrate the scenarios which do require significant lock time. FIG. 5 shows that the first rising edge of the Fv is slightly before the second rising edge of the Fr. Both Fv and Fr have the same period (frequency); however, since the first rising edge of Fr is essentially skipped, the PU signal is provided to speed up the VCO and to push Fv to catch up with the Fr. FIG. 6 shows that the first rising edge of the Fr is slightly before the second rising edge of the Fv; therefore, the PD signal is provided to slow down the VCO and to cause the Fv to slow down and sync with the Fr. In both cases illustrated in FIG. 5 and FIG. 6, the PLL will push the VCO away from zero frequency error in order to add or remove an entire clock cycle. This will cause the PLL to exhibit a significant lock time even though the initial frequency errors in FIG. 5 and FIG. 6 are zero.

FIG. 7 depicts a relationship diagram of a tuning voltage Vtune and a VCO frequency of a conventional VCO. If the system attempts to lock the PLL at the frequency Fi, and it encounters the phase error as illustrated in the FIG. 6, then the PLL will react as if the VCO is too fast and it will slow the VCO down. Because the VCO must slow down until an entire cycle is slipped, the tuning voltage will be pushed towards left and it will quickly hit the low supply rail because the VCO/LPF can't go lower than Vtune Minimum. FIG. 8 shows a plot of tuning voltage versus time in this scenario. If the VCO had a wider frequency tuning range, which permits the PFD to push the VCO and Fv as far in frequency as needed to skip/add a cycle as shown in the FIG. 5 and FIG. 6, then the lock time can be shortened because the nonlinearity at the supply rail would not be encounter. However, since a low Kv is desirable for minimizing phase noise, a wide tuning range for a VCO is not ideal in many applications.

There are few U.S. patents which use the analog "gear shifting" approach in enhancing the phase locking time. The U.S. Pat. No. 6,906,565 issued to Keaveney entitled "fast lock phase lock loop and method thereof". The U.S. Pat. No. 6,504,437 issued to Nelson entitled "low-noise, fast-lock phase lock loop with gear shifting control". The U.S. Pat. No. 6,940,356 issued to McDonald entitled "circuitry to reduce PLL lock acquisition time". Each of these patents discloses increasing the PLL bandwidth during acquisition, and subsequently decreasing for low noise after lock is achieved. Bandwidth is changed by altering charge pump currents and/or loop filter resistor values. The analog method of the patent presents a challenge task in term of implementation; a glitch-free bandwidth switchover might be difficult to implement. In addition, these patents do not address PLL auto-calibration, which would cause additional lock time in all of these patents.

The U.S. Pat. No. 7,327,196 issued to Goldberg entitled "fast switching phase lock loop device and method", which discloses a PLL having a voltage controlled oscillator that generates a signal at a frequency according to a received voltage. Goldberg discloses a memory holding a set of adjustment values. With each adjustment value set, the VCO can be tuned to a desired frequency. Goldberg requires a very accurate DAC and ADC, and Goldberg does not address the phase alignment issue, which can cause the long initial phase lock time even if initial frequency error is zero.

The U.S. Pat. No. 4,560,950 issued to Cabot entitled "method and circuit for phase lock loop initialization". The U.S. Pat. No. 5,304,951 issued to Cosand entitled "divider synchronization circuit for phase-locked loop fast phase locking system". These patents disclose that the PFD and N-divider are held in reset and initialized by a control signal until the next rising edge of the VCO. This helps the PLL to initialize with the PFD inputs near zero phase difference. However, these patents provide no measure to ensure that the VCO is at the correct initial frequency. These patents also do not pre-charge the loop filter. In addition, if there is pump up/down mismatch or leakage in the charge pump, the desired initial phase is not zero. Furthermore, these patents provide an alignment which only gets the PFD inputs close to the desired operation point.

In view of these current practices, there is a need to enhance the initial phase lock time before entering the PLL mode and yet ensure the VCO is operating at a desired frequency.

SUMMARY OF THE INVENTION

In view of the desired enhancement as discussed above, the current invention provides an automatically calibrated fractional-N phase lock loop (PLL), and a method to reduce the locking time for a PLL operation thereof. The current invention provides a secondary feedback loop around the existing FLL that forces the transient operating conditions of the N-divider (NDIV), PFD, CP, and LPF to reach their desired lock conditions before the FLL is switched off and the system enters PLL mode.

This secondary loop works by comparing the output voltage of the FLL DAC to the LPF output voltage and then using this value to modulate the N-divider value. Since the N-divider controls the phase of the signal (Fv) that is presented to the PFD, this completes a secondary loop around the components of the PLL that are unused during FLL mode of the design illustrated in FIG. 9. When this secondary feedback loop reaches steady state the output voltage from the LPF will track the DAC output voltage and since the FLL is also locked this DAC voltage is equal to the value that drives the VCO to the desired lock frequency (i.e. the loop filter is pre-charged), and the phase error at the input to the PFD is exactly the error required to produce zero average current out of the charge pump, (i.e. zero phase error if the pump up and pump down currents match exactly and there is no leakage). When this condition is met, the loop is essentially already in lock and the lock transient from FLL mode to PLL mode will be minimal.

According to one embodiment of the present invention, a fast phase locking system is provided. The fast phase locking system comprises a frequency divider generating a divided frequency with a dividing value, a phase frequency detector (PFD) receiving the divided frequency and a reference frequency, wherein the PFD generates a PFD output signal by comparing the divided frequency and the reference frequency, a charge pump (CP) receiving the PFD output signal and a charge pump compensating signal, and generates a CP output signal, a digital loop controller (DLC) receiving the divided frequency and the reference frequency, wherein the DLC generates the charge pump compensating signal, a compensating voltage output signal, and a coarse tuning signal, a digital analog converter (DAC) receiving the compensating voltage output signal and generating a DAC output signal, a loop filter (LPF) receiving the CP output signal and generating a LPF output signal, a comparator receiving the DAC output signal and the LPF output signal, and generating a comparison result, and a voltage control oscillator (VCO) receiving the coarse tuning signal, the DAC output signal, and the LPF output signal, wherein the comparator provides the comparison result to modulate the dividing value.

According to another embodiment of the present invention, a method for synthesizing a frequency is provided. The method comprises generating a divided frequency with a dividing value by a frequency divider, receiving the divided frequency and a reference frequency at a phase frequency detector (PFD), comparing the divided frequency and the reference frequency to generating a PFD output signal by the PFD, receiving the PFD output signal at a charge pump (CP), receiving a charge pump compensating signal at the CP, generating a CP output signal by the CP, receiving the divided frequency and the reference frequency at a digital loop controller (DLC), generating the charge pump compensating signal, a compensating voltage output signal, and a coarse tuning signal by the DLC, receiving the compensating voltage output signal at a digital analog converter (DAC), generating a DAC output signal by the DAC, receiving the CP output signal at a loop filter (LPF), generating a LPF output signal by the LPF, receiving the DAC output signal and the LPF output signal at a comparator, generating a comparison result by the comparator, modulating the dividing value by the comparison result, and providing a voltage control oscillator (VCO) for receiving the coarse tuning signal, the DAC output signal, or the LPF output signal.

BRIEF DESCRIPTION OF THE DRAWINGS

The present invention can be exemplified by the preferred embodiment as described hereinafter, and become more readily apparent to those with ordinary skills in the relevant art, in which.

DETAILED DESCRIPTION OF THE PREFERRED EMBODIMENT

The present invention can be exemplified by the preferred embodiment as described hereinafter. An FLL system is used for coarse tuning a VCO and for calibrating for VCO Kv variation. The current invention provides a second feedback loop around the existing FLL. The secondary feedback loop forces the signal traveled on the route of NDIV-PFD-CP-LPF to essentially reach a desired lock condition before the FLL is switched off and the system enters PLL mode, thus achieving the goals of PLL calibration and fast locking.

Figure 1:
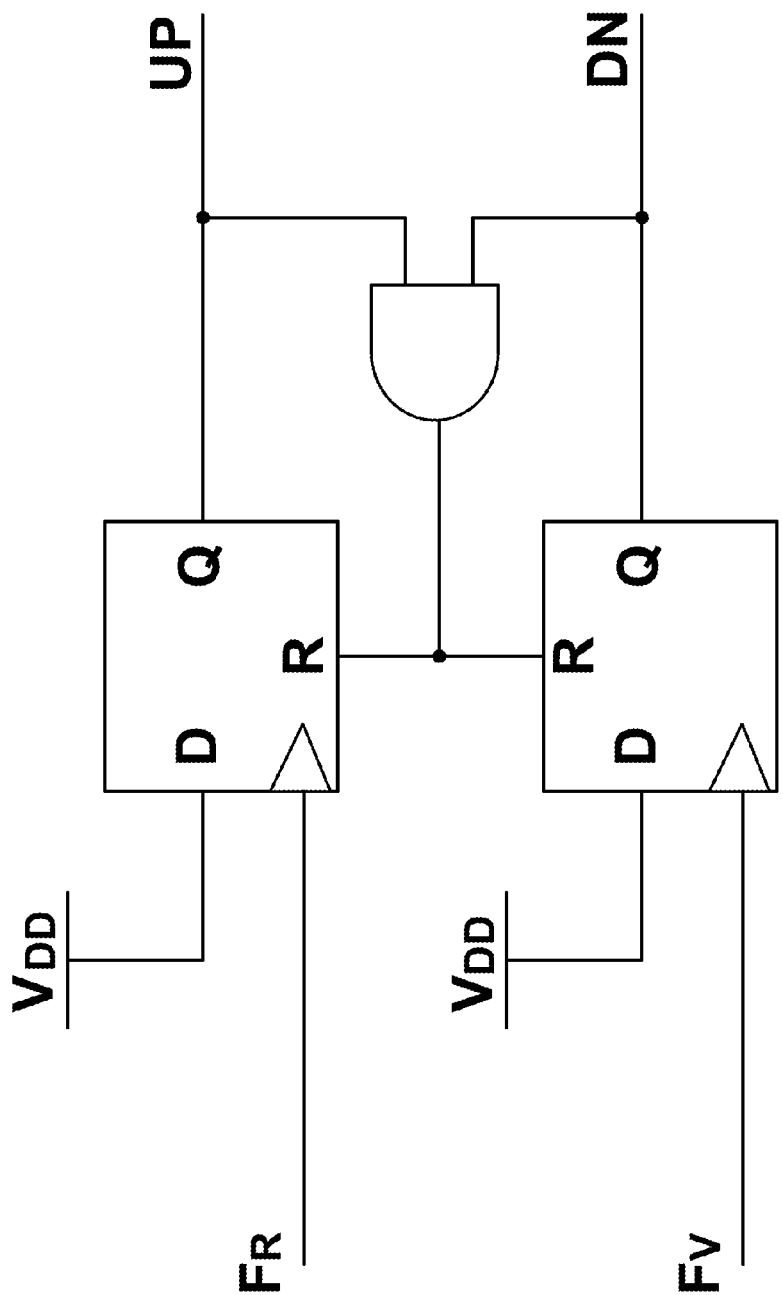
FIG. 1 is a diagram for a conventional 3-state phase frequency detector.
Figure 2:
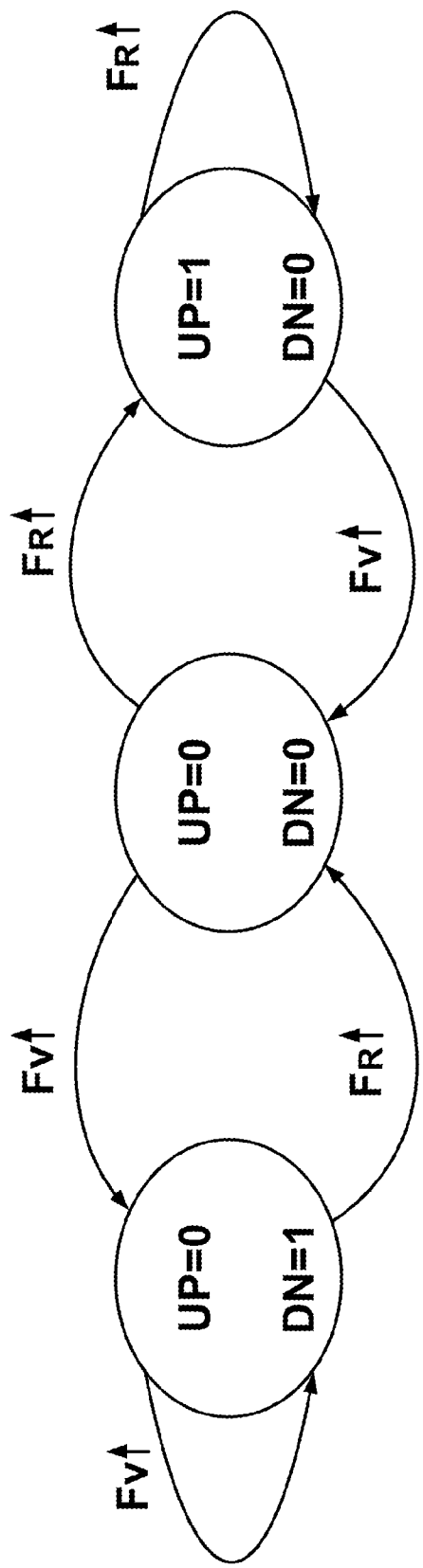
FIG. 2 is a diagram for 3 different states of the 3-state phase frequency detector.
Figure 3:
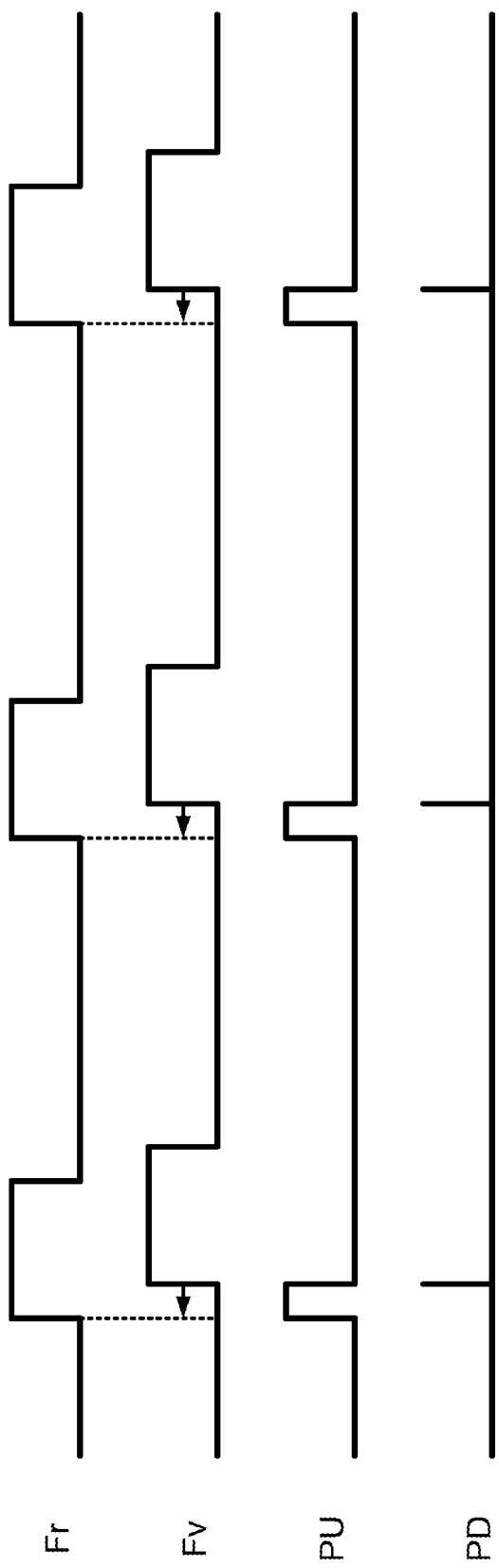
FIG. 3 is a diagram for illustrating the relationship among the reference frequency (Fr), divided frequency (Fv), the pump-up (PU) signal, and the pump-down (PD) signal in a conventional VCO phase locking scenario.
Figure 4:
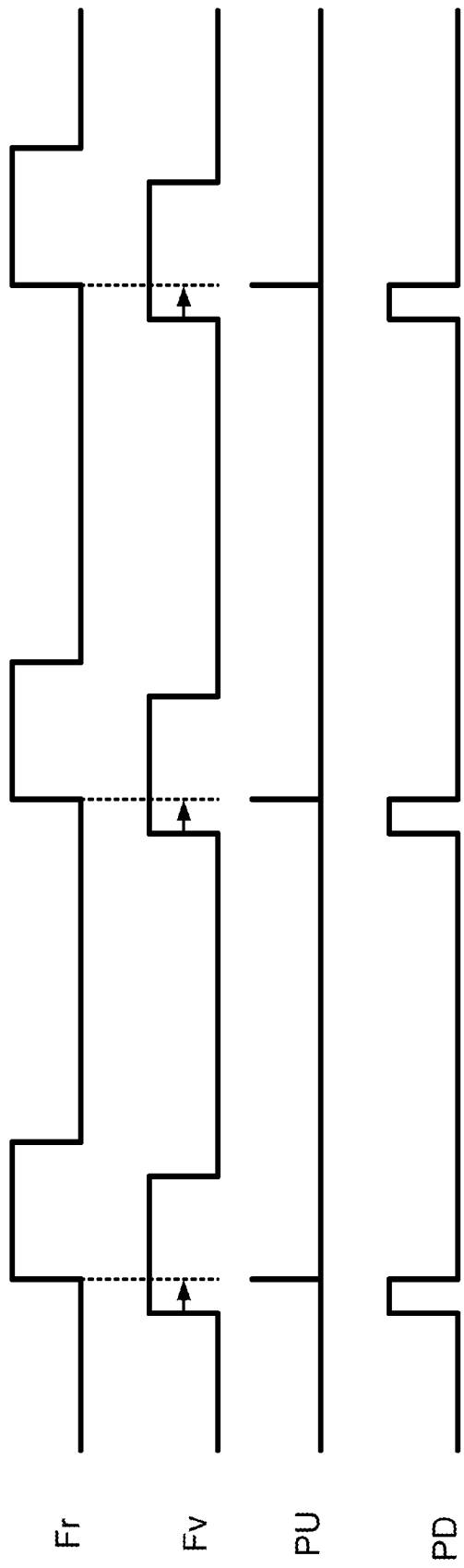
FIG. 4 is a diagram for illustrating the relationship among the reference frequency (Fr), divided frequency (Fv), the pump-up (PU) signal, and the pump-down (PD) signal in another conventional VCO phase locking scenario.
Figure 5:
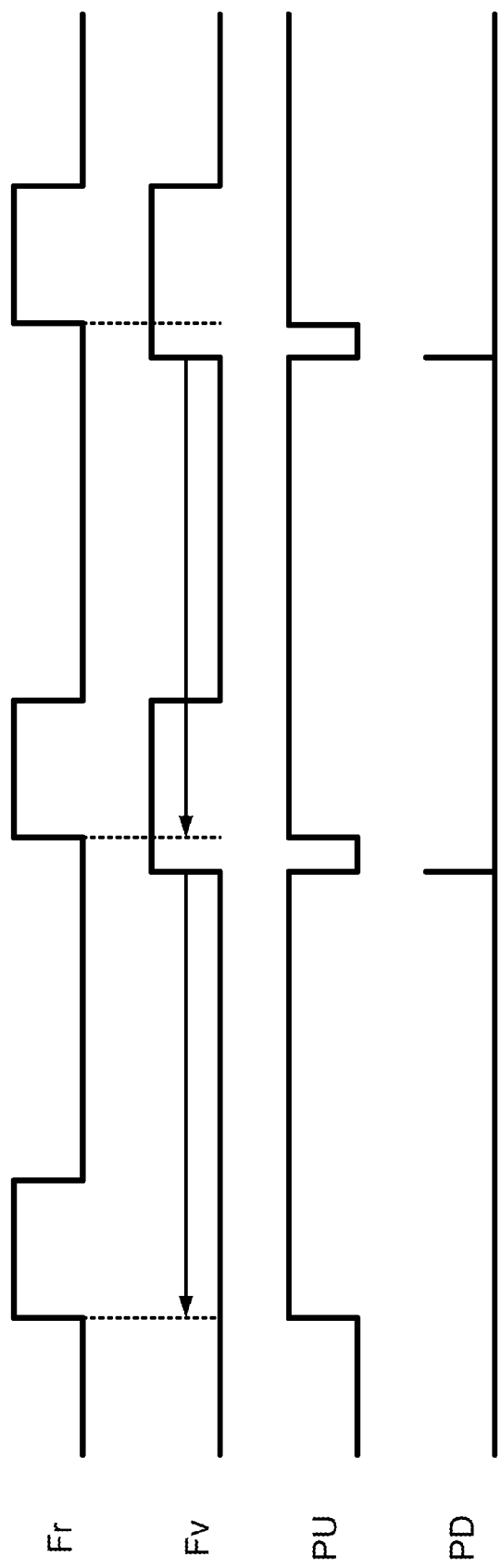
FIG. 5 is a diagram for illustrating the relationship among the reference frequency (Fr), divided frequency (Fv), the pump-up (PU) signal, and the pump-down (PD) signal in another conventional VCO phase locking scenario.
Figure 6:
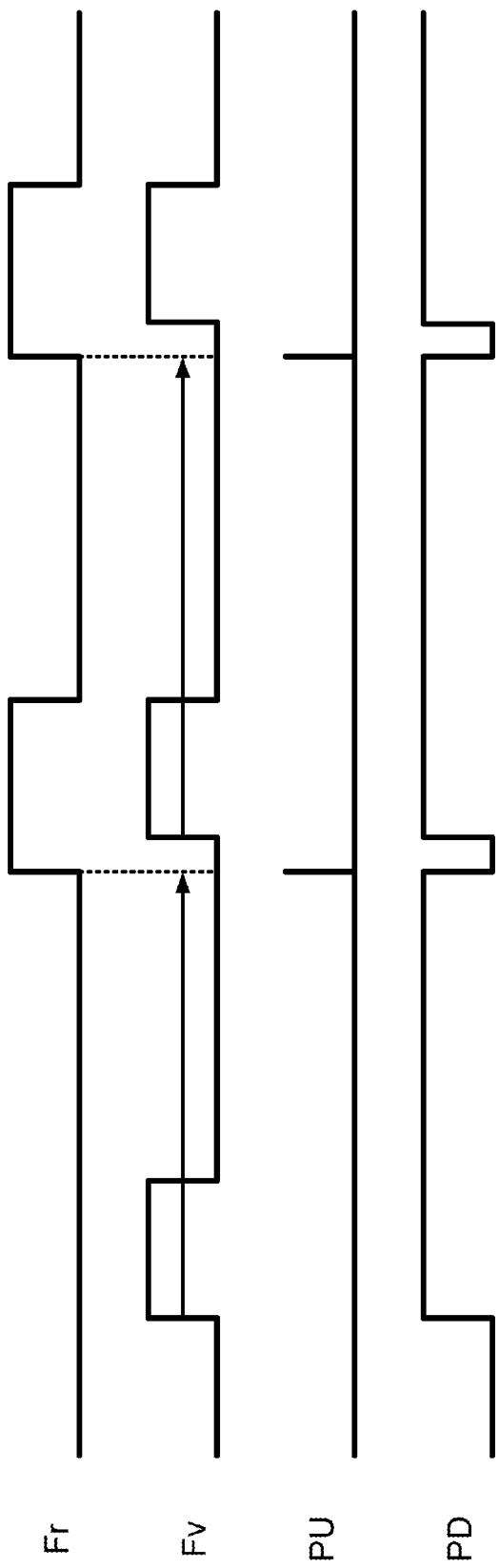
FIG. 6 is a diagram for illustrating the relationship among the reference frequency (Fr), divided frequency (Fv), the pump-up (PU) signal, and the pump-down (PD) signal in another conventional VCO phase locking scenario.
Figure 7:
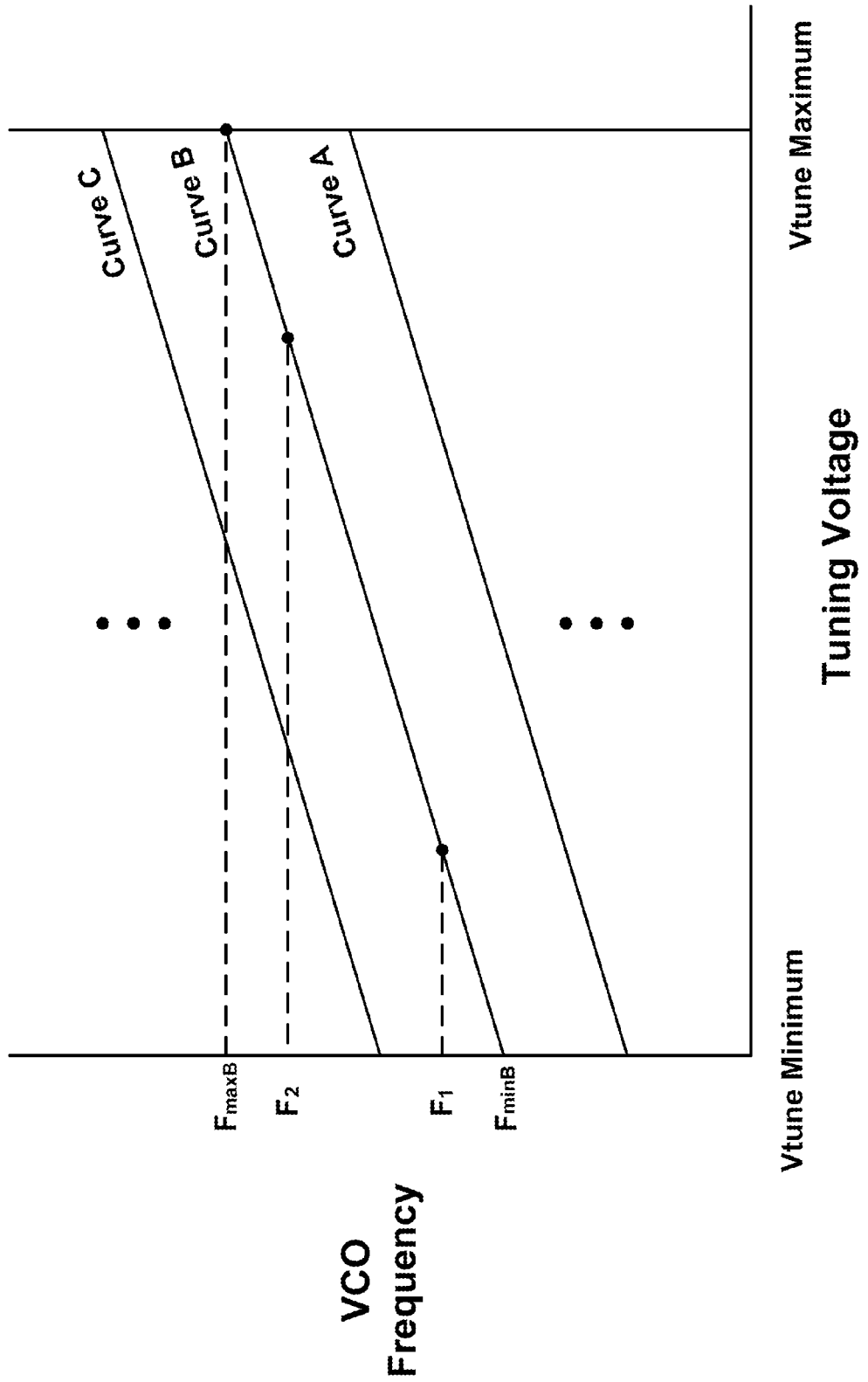
FIG. 7 depicts a relationship diagram of a tuning voltage Vtune and a VCO frequency of a conventional VCO.
Figure 8:
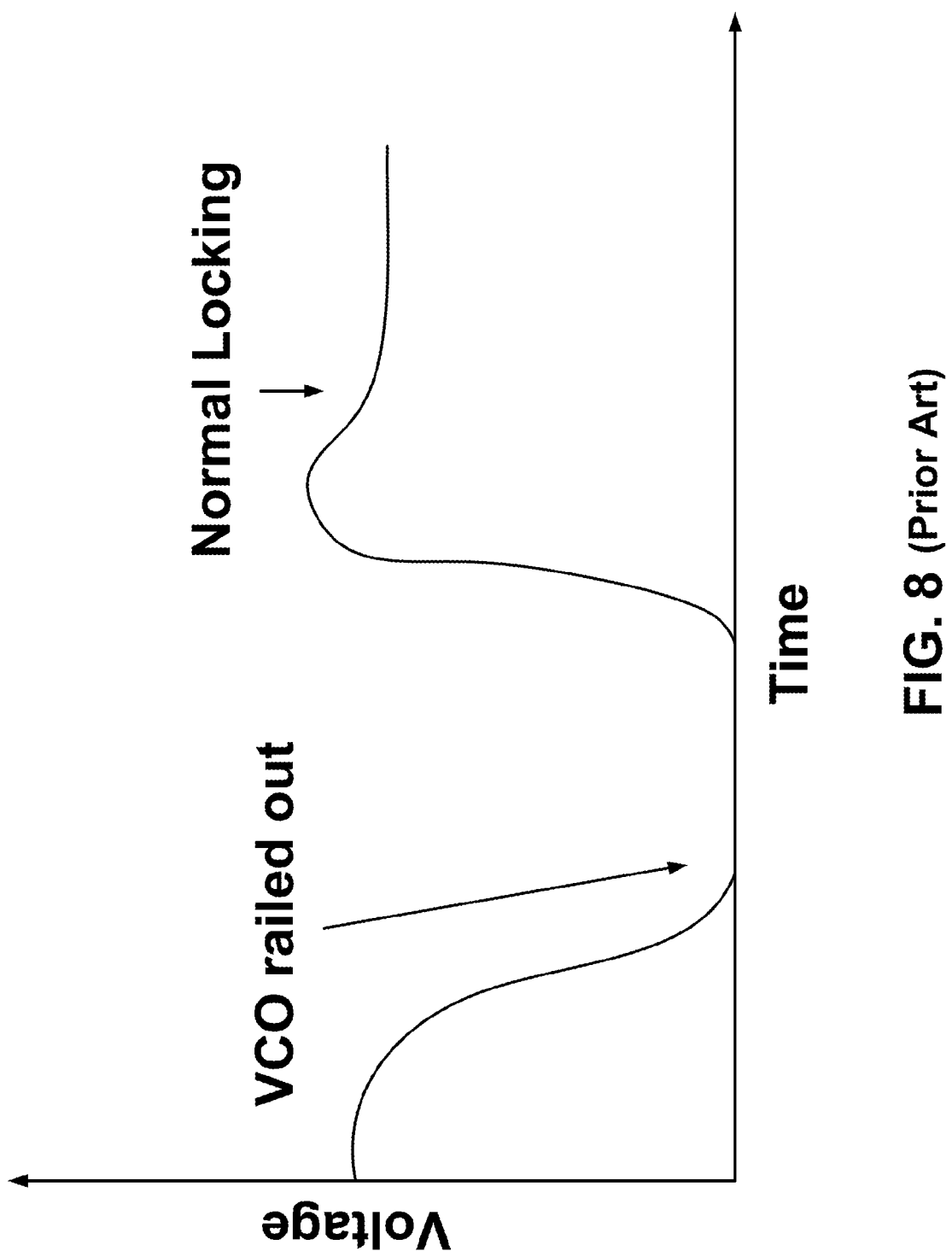
FIG. 8 is a diagram for illustrating the relationship among the reference frequency (Fr), divided frequency (Fv), the pump-up (PU) signal, and the pump-down (PD) signal in a conventional VCO phase locking scenario.
Figure 9:
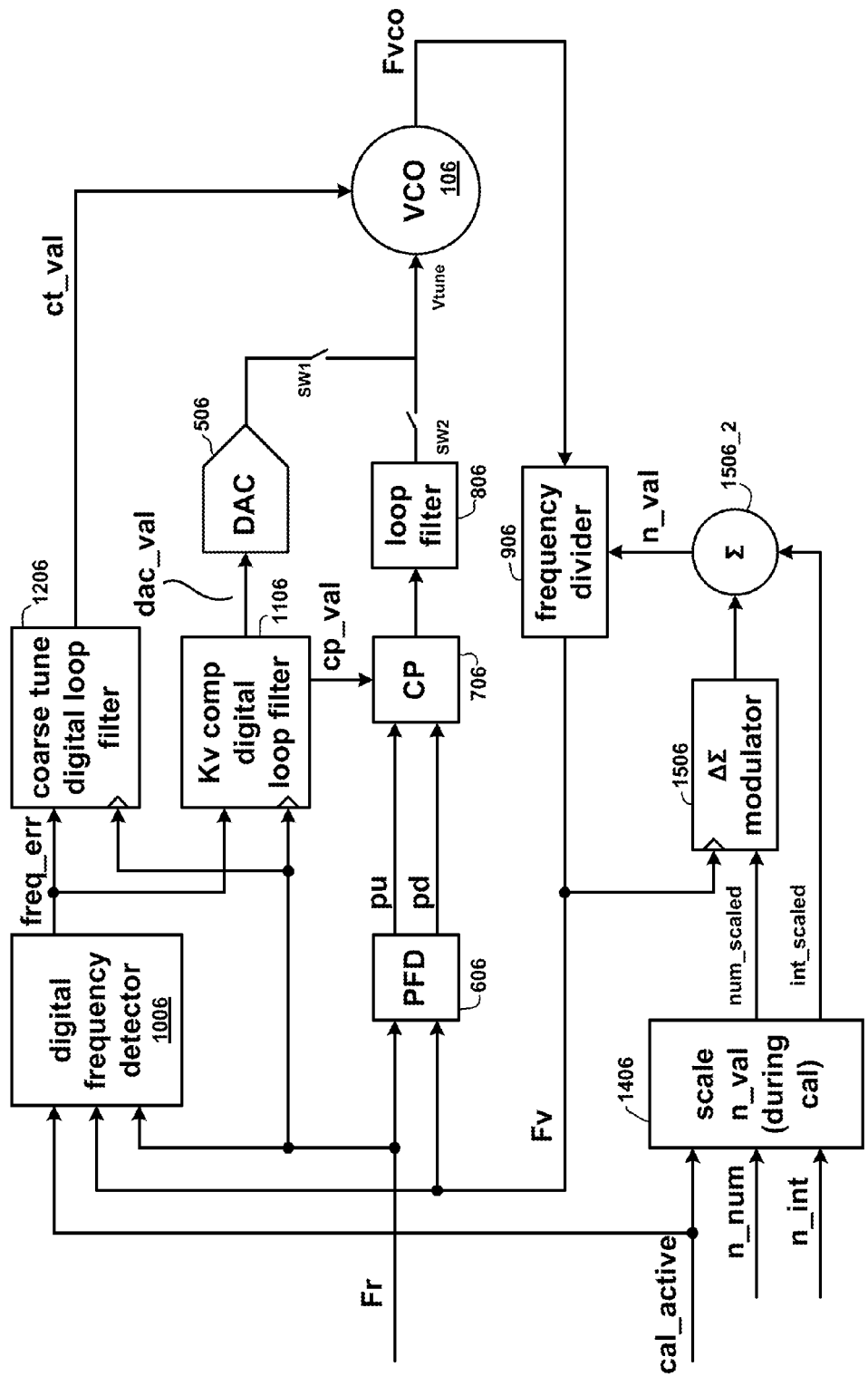
FIG. 9 is a schematic diagram for a conventional locking system for a fractional-N PLL.
Figure 10:
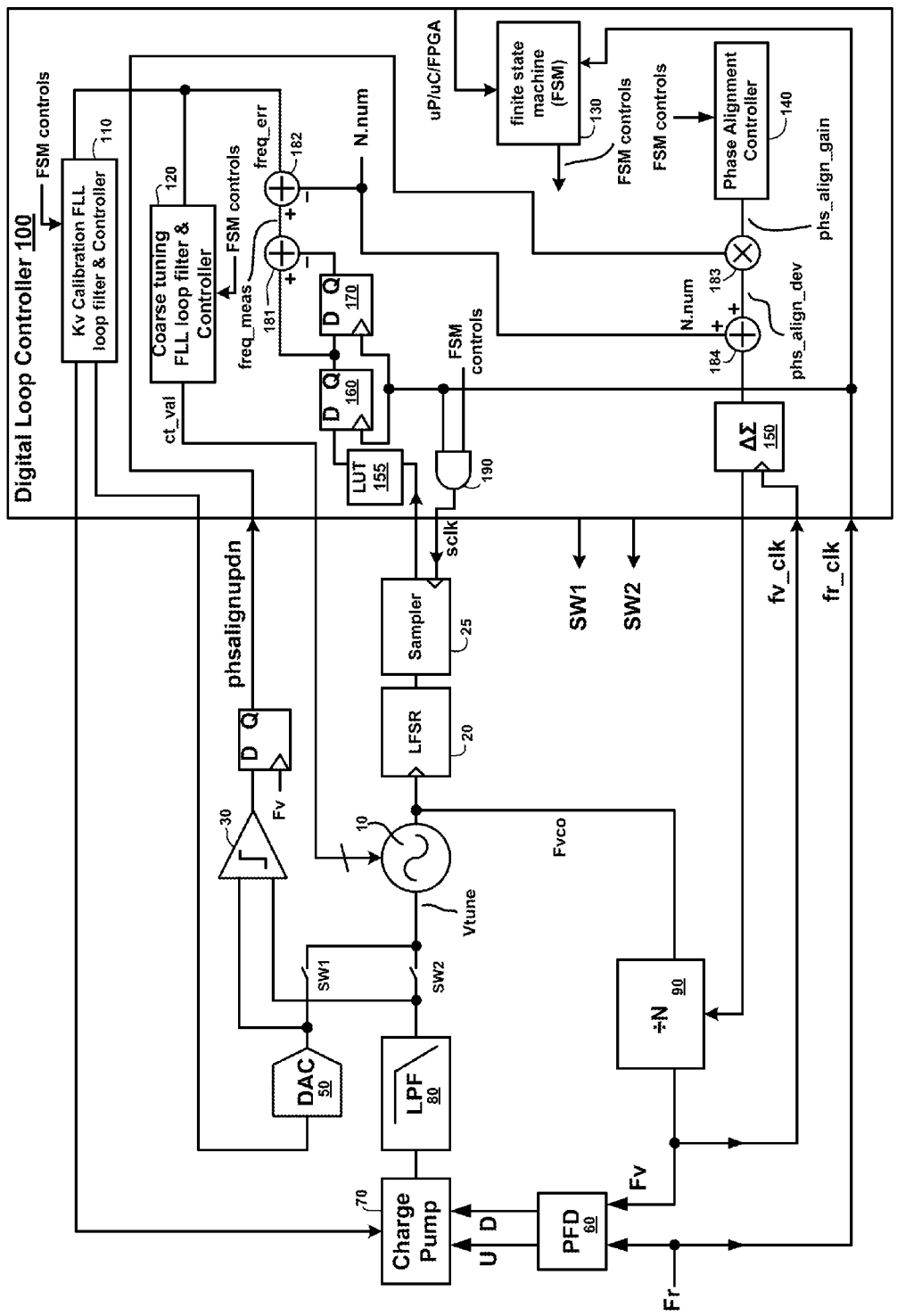
FIG. 10 is a schematic diagram for a fast locking system for a fractional-N PLL according to the current invention.

FIG. 10 is a schematic diagram for a fast locking system for a fractional-N PLL according to the current invention. The FIG. 10 illustrates a VCO 10, a digital loop controller 100, a DAC 50, and the PLL components including a phase frequency detector 60, a charge pump 70, and a loop filter 80. The DAC 50 can also be an integrated part of the digital loop controller 100. This invention, as depicted in FIG. 10, discloses a secondary feedback loop including N-divider 90, the PFD 60, the CP 70, the LPF 80, and the comparator 30. This secondary feedback loop of the NDIV-PFD-CP-LPF is closed by comparing the loop filter voltage to the output of the FLL DAC 50, thus the FLL acts as a master feedback loop and this secondary loop acts as a slave.

The coarse tuning loop is explained as the following. As shown in FIG. 10, during the coarse tuning, the coarse tuning FLL loop filter/controller 120 provides a control voltage to the VCO 10. The VCO 10 then outputs the VCO frequency to a digital frequency detector, and the digital frequency detector outputs the detecting result to the coarse tuning FLL loop filter/controller 120. The digital frequency detector receives and processes the output signal from the VCO 10 during the course tuning. The digital frequency detector comprises the linear feedback shift register (LFSR) 20, the sampler 25, the look up table (LUT) 155, the first flip-flop 160, the second flip-flop 170, a first subtractor 181, and a second subtractor 182. The first flip-flop 160 and the second flip-flop 170 are connected in serial; and the first subtractor 181 and the second subtractor 182 are also connected in serial. The digital frequency detector can be either an integrated part of the digital loop controller 100 or a partial integrated into the digital loop controller 100.

The LFSR 20 receives Fvco from VCO 10. The Fvco is sampled and the sample is decoded by the LUT 155 to produce a binary count sequence as the following. The sampler 25 processes the output of the LFSR 20 upon receiving the clock signal sclk from the AND gate 190, and then the sampler 25 outputs to the LUT 155, and the LUT 155 outputs to the first flip-flop 160 and the second flip-flop 170 in sequence. The LUT 155 maps the sampled LFSR 20 sequence value into a binary sequence value, and the LUT 155 operates at the sclk frequency which is much slower. This mapping is necessary because the LFSR 20 output is a repeating sequence with pseudo-random values. The LUT 155 may be implemented with any suitable storage media, such as a ROM. The LFSR 20 and LUT 155 are used instead of a binary counter since the LFSR 20 is more easily implemented for high speed operation. After the first flip-flop 160 receives signal from LUT 155, the first flip-flop 160 pushes the data to both the second flip-flop 170 and the first subtractor 181; while the second flip-flop 170 pushes the data only to the first subtractor 181. The first subtractor 181 measures the frequency by comparing the received information, and then forwards the compared result freq_meas to the second subtractor 182. The second subtractor 182 receives the compared result freq_meas from the subtractor 181 and then outputs the freq err to both the Kv compensation loop filter/controller 110 and the coarse tuning FLL loop filter/controller 120. The coarse tuning FLL loop filter/controller 120 then outputs a coarse tuning word to the digital coarse tuning input ct_val of the VCO 10.

In addition to the coarse tuning loop, the digital loop controller 100 also provides a Kv calibration loop. Whether the coarse tuning or Kv calibration loop is active depending on the state of calibration finite state machine (FSM) 130. The inputs of the FSM 130 are various programmable signals; those programmable signals can be from a microprocessor, a microcontroller, or a field-programmable gate array (FPGA). Besides providing signal to the coarse tuning FLL loop filter/controller 120, the second subtractor 182 also outputs to the Kv calibration FLL loop filter/controller 110. The Kv Calibration FLL loop filter/controller 110 then issues a compensating voltage output signal to the digital-to-analog converter 50. The digital-to-analog converter 50 converts the received compensating voltage output signal into an analog signal, and then feeds the analog signal via the switch SW1 to the analog input port (Vtune) of the VCO 10. In an alternative embodiment, the compensating voltage output signal can also be either a constant predetermined voltage or a programmable voltage to accelerate the locking time for the secondary feedback control loop.

As discussed above, both the coarse tuning loop and the Kv calibration loop do not necessarily set the VCO's output frequency phase at the best position before exiting the FLL mode and entering the PLL mode. The secondary feedback control loop is explained as the following. In addition to provide the analog control signal to the Vtune port of the VCO 10, the DAC 50 also provides the same signal to the comparator 30. The comparator 30 receives signals from both the DAC 50 and the LPF 80, and it compares the output voltage of the DAC 50 to the LPF output voltage. The comparator 30 then forwards this compared result to the digital loop controller 100 to modulate the dividing value. An alternative embodiment of the invention replaces the comparator 30 with an analog-to-digital converter, which will make this secondary feedback loop less quantized than the 2 output levels available from a simple comparator. The VCO 10 outputs to the frequency divider 90, and the divider 90 then generates the Fv based on the dividing value. The dividing value is programmable over a wide range of integer N values and modulated by a delta sigma modulator 150 to realize fractional-N divide values. The divider 90 receives the Fvco, and then generates and provides the Fv to the PFD 60, then to the CP 70 and loop filter 80. The switch SW2 is open during this coarse tuning stage; therefore, the loop filter 80 does not forward any signal to VCO 10 during this time, and it only forwards its signal to the comparator 30.

The digital loop controller 100 includes a finite state machine (FSM) 130. The FSM 130 issues various control signals (denoted as rsm signals in FIG. 10) to control each of the loops. The FSM 130 controls which signal will be sent to the Vtune analog input port of the VCO 10 by controlling the switch SW1 and switch SW2. The FSM 130 closes the switch SW1 and opens the switch SW2 under the FLL mode; and it opens the switch SW1 and closes the switch SW2 under the PLL mode. The FSM 130 also controls the digital frequency detector by controlling the AND gate 190. The FSM 130 further controls each of the aforementioned loops by sending the respective controlling signal to the coarse tuning FLL loop filter/controller 120, the Kv calibration FLL loop filter/controller 110, and the phase alignment controller 140.

Figure 11:
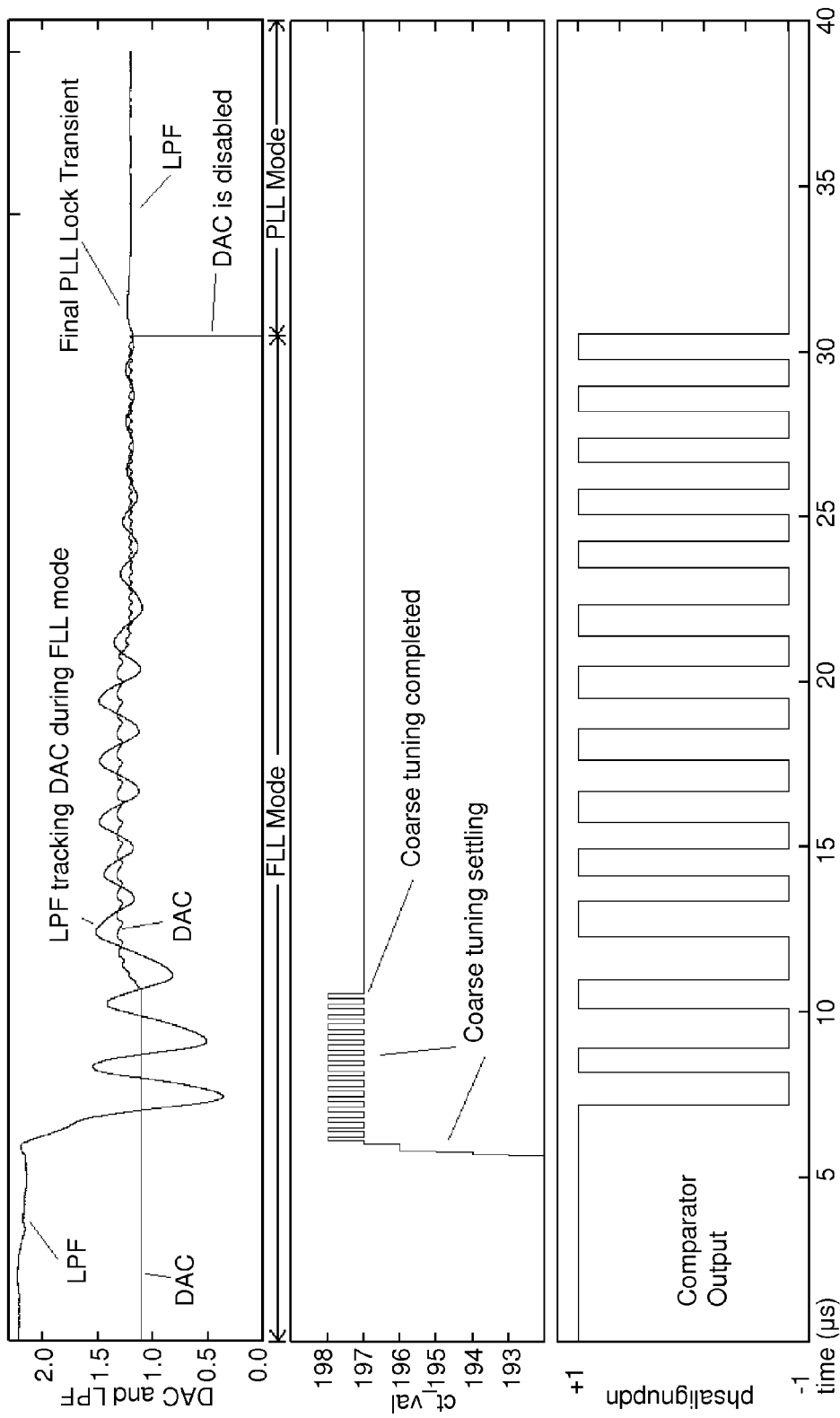
FIG. 11 depicts relationship diagrams of the DAC, LPF, coarse tunning signal, and the comparator output under the FLL mode and the PLL mode according to the current invention.

In the preferred embodiment, the compared result between the DAC output and the LPF output is a single bit digital signal (phsalignupdn) corresponding to +1 and −1. This signal is routed into the digital block 183 where it is multiplied by a phs_align_gain from the phase alignment controller 140. During the FLL calibrations for VCO coarse tuning and VCO Kv, the digital block 183 generates the phs_align_dev value based on the phsalignupdn value and the phs_align_gain. As illustrated in the bottom figure of FIG. 11, phsalignupdn is either +1 or −1; therefore, there are only 2 valid values for phs_align_dev: +phs_align_gain and −phs_align_gain. The phs_align_dev is forwarded to the adder 184 and then summed with the N.num signal which also controls the target frequency. The ratio between the VCO output frequency Fvco and the reference frequency Fr is N.num. The "N" is the integer part of the ratio, and the "num" is the fractional part of the ratio, which provides that Fvco=Fr*N.num. This combined signal of phs_align_dev and N.num then goes in the delta sigma modulator 150 and ultimately controls the dividing value sequence loaded into the N-divider 90. Besides operating on the "N", the delta sigma modulator 150 operates on "num", the fractional part of the ratio; and it produces a sequence of integer values whose time average is equal to "num". Hence, by combining the operations on both the "N" and the "num", the delta-sigma modulator 150 controls the divider 90 to operate on average at the ratio of N.num. Thus, the error between the DAC output and the LPF output voltage is used to modulate the N-divider.

Since the VCO is locked by the FLL, the nominal output frequency of the N-divider is identical to the reference frequency. Because the VCO frequency is held relatively constant by the FLL, modulating the N.num will modulate output frequency of the N-divider 90 around the nominal value that is equal to the reference frequency Fr. This modulation thus causes frequency deviation on Fv, and thus it enables the phase to be accelerated or decelerated by this secondary feedback loop until a phase lock is achieved at the inputs to the PFD 60.

The lock condition of the phase alignment loop will occur when the average current delivered by the charge-pump drops to zero, and this condition is the same lock condition as desired in the fine-PLL loop. Thus, as illustrated in the top figure of FIG. 11, this secondary feedback loop pushes the Fv and Fr at the PFD input 60 into the proper phase relationship during the operation of the FLL calibration, and so the phase lock time is minimized when the FLL is turned off and the PLL is engaged. The switching from the FLL mode to the PLL mode should be done when the comparison result, which is the differences between the LPF output signal and the DAC output signal, is minimal. Ideally, the switching should be done when the comparison result is zero; a programmable threshold or a predetermined threshold can also be adapted to determine whether the comparison result has reached an acceptable value.

By the nature of this secondary loop, the loop filter 80 is also pre-charged to the correct locked voltage. A common practice in Fractional-N synthesizers is to utilize a leakage current to improve the linearity of the charge pump, by avoiding the PFD dead zone. When a leakage current is added to the charge pump output in this manner the desired Fv/Fr relationship is not a phase offset of zero. The static phase offset will depend on the amount of leakage current that system is using, mismatch between pump up/down, and the reset delay of the PFD. The phase alignment system of the present invention also locks to the desired static phase offset in the presence of this leakage current. The invention achieves this because the system aligns the PFD inputs to have the proper phase relationship such that the average output current of the charge pump into the loop filter is zero. The tuning performance can be further adjusted by the duration of the modulation on the dividing value N. In an alternate embodiment the system can continue modulating the dividing value N after the system has been switched from the FLL mode into the PLL mode, to realize a soft switchover from FLL/phase alignment mode into PLL mode.

The comparator/digital loop controller/N-divider are analogous to a VCO in a PLL, thus this secondary loop is a PLL with a quantizer in the feedback loop. This can be reconciled by noting that at the high level viewpoint, the LPF output voltage is still translated into a frequency (at the output of the N-divider). The clocked comparator serves as a 2-level quantizer. In an alternate embodiment a system can be constructed wherein the 2-level quantizer is replaced by an ADC, and the phase alignment scheme would still be realized but it would be easier to recognize as a PLL since the voltage to frequency conversion is a little more clearly defined. In a system without any DAC for Kv calibration, the current invention can still pre-charge the LPF to a reference voltage that is used for coarse tuning the VCO.

While the invention has been described in terms of what is presently considered to be the most practical and preferred embodiments, it should be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A phase lock loop (PLL), comprising:
    a frequency divider generating a divided frequency with a dividing value;
    a phase frequency detector (PFD), coupled to said frequency divider, receiving said divided frequency and a reference frequency and generating a PFD output signal by comparing said divided frequency and said reference frequency;
    a charge pump (CP), coupled to said PFD, receiving said PFD output signal and generating a CP output signal;
    a loop filter (LPF), coupled to said CP, receiving said CP output signal and generating a LPF output signal;
    a voltage control oscillator (VCO), coupled to said LPF and said frequency divider, outputting a VCO signal;
    a controlling circuit, coupled to the VCO and the frequency divider, receiving said VCO signal, said divided frequency and said reference frequency, and generating a compensating voltage output signal; and a comparator, coupled to said controlling circuit and said LPF, generating a comparison result by comparing said compensating voltage output signal and said LPF output signal;

wherein said controlling circuit modulates said dividing value according to said comparison result.

2. The PLL as recited in the claim 1, wherein said compensating voltage output signal is a predetermined voltage or a programmable voltage.

3. The PLL as recited in the claim 1, wherein the controlling circuit further generates, a coarse tuning signal which is used to coarse tune the VCO.

4. The PLL as recited in the claim 3, wherein said controlling circuit comprises a digital frequency detector receiving said VCO signal and said reference frequency, and generating a frequency error signal according to said VCO signal and said reference frequency;

a coarse tuning loop filter controller receiving said frequency error signal and generating said coarse tuning signal; and a Kv compensation loop filter controller controller receiving said frequency error signal and generating said compensating voltage output signal and said CP compensating signal.

5. The PLL as recited in the claim 1, wherein the controlling circuit is also coupled to said CP and further generates a CP compensating signal, which is used to compensate the CP.

6. The PLL as recited in the claim 5, wherein said controlling circuit comprises a digital frequency detector receiving said VCO signal and said reference frequency, and generating a frequency error signal according to said VCO signal and said reference frequency;

a coarse tuning loop filter controller receiving said frequency error signal and generating said coarse tuning signal; and a Kv compensation loop filter controller receiving said frequency error signal and generating said compensating voltage output signal and said CP compensating signal.

7. The PLL as recited in the claim 1, further comprising a first switch, coupled between said controlling circuit and said VCO, receiving said compensating voltage output signal and outputting said compensating voltage output signal to said VCO; and a second switch, coupled between said LPF and said VCO, receiving said LPF output signal and outputting said LPF output signal to said VCO.

8. The PLL as recited in the claim 1, wherein said controlling circuit controls said first switch to close and said second switch to open to forward said compensating voltage output signal to said VCO under a coarse tuning mode, and controls said second switch to close and said first switch to open to forward said LPF output signal to said VCO under a fine tuning mode.

9. The PLL as recited in the claim 1, wherein said controlling circuit modulates said dividing value according to said comparison result under a frequency lock loop (FLL) mode.

10. The PLL as recited in the claim 1, wherein said controlling circuit modulates said dividing value according to said comparison result under both a frequency lock loop (FLL) mode and a phase lock loop (PLL) mode.

11. The PLL as recited in the claim 1, wherein said comparator is implemented by an analog-to-digital converter.

12. A method for enhancing a phase locking for a PLL, wherein said PLL comprises a frequency divider, a phase frequency detector (PFD), a charge pump (CP), a loop filter (LPF), and a voltage control oscillator (VCO), said method comprising:

generating a divided frequency with a dividing value by said frequency divider;

generating a PFD output signal at said PFD by comparing said divided frequency and a reference frequency;

receiving said PFD output signal at said (CP);

generating a CP output signal by said CP according to said PFD output signal;

receiving said CP output signal at said LPF;

generating a LPF output signal by said LPF according to said CP output signal;

generating a VCO signal by said VCO;

generating a compensating voltage output signal according to said VCO signal, said divided frequency, and said reference frequency; and generating a comparison result by comparing said compensating voltage output signal and said LPF output signal;

wherein said dividing value is modulated according to said comparison result.

13. The method as recited in the claim 12 further comprising generating a coarse tuning signal according to said VCO signal and said reference frequency signal; and inputting said coarse tuning signal to said VCO to perform a coarse tuning on said VCO.

14. The method as recited in the claim 12 further comprising generating a CP compensating signal according to said VCO signal and said reference frequency signal; and inputting said CP compensation signal to said CP to compensate said CP.

15. The method as recited in the claim 12, where said compensating voltage output signal is a predetermined voltage or a programmable voltage.

16. The method as recited in the claim 12, further comprises controlling said compensating voltage output signal to be forwarded to said VCO and controlling said LPF output signal to be not forwarded to said VCO under a coarse tuning mode; and controlling said LPF output signal to be forwarded to said VCO and controlling said compensating voltage output signal to be not forwarded to said VCO under a fine tuning mode.

17. The method as recited in the claim 12, wherein said dividing value is modulated according to said comparison result under a frequency lock loop (FLL) mode of said PLL.

18. The method as recited in the claim 12, wherein said dividing value is modulated according to said comparison result under both a frequency lock loop (FLL) mode and a phase lock loop (PLL) mode of the PLL.

* * * * *